(12) United States Patent
Yvon

(10) Patent No.: US 9,991,341 B2
(45) Date of Patent: Jun. 5, 2018

(54) METHOD FOR TREATING A GALLIUM NITRIDE LAYER COMPRISING DISLOCATIONS

(71) Applicant: STMICROELECTRONICS (TOURS) SAS, Tours (FR)

(72) Inventor: Arnaud Yvon, Saint-Cyr sur Loire (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days. days.

(21) Appl. No.: 15/363,616

(22) Filed: Nov. 29, 2016

(65) Prior Publication Data

US 2017/0077225 A1    Mar. 16, 2017

Related U.S. Application Data

(63) Continuation of application No. 14/464,158, filed on Aug. 20, 2014, now Pat. No. 9,536,747.

(30) Foreign Application Priority Data

Aug. 30, 2013 (FR) ...................... 13 58324

(51) Int. Cl.
*H01L 29/06* (2006.01)
*H01L 21/02* (2006.01)
(Continued)

(52) U.S. Cl.
CPC .... *H01L 29/0661* (2013.01); *H01L 21/02002* (2013.01); *H01L 21/0254* (2013.01); *H01L 21/02381* (2013.01); *H01L 21/02458* (2013.01); *H01L 21/02494* (2013.01); *H01L 21/02579* (2013.01); *H01L 21/02664* (2013.01); *H01L 21/30612* (2013.01); *H01L 21/30621* (2013.01);
(Continued)

(58) Field of Classification Search
CPC ............... H01L 29/0661; H01L 29/872; H01L 21/02579; H01L 29/36; H01L 21/30612; H01L 21/30621; H01L 21/02002; H01L 29/66212; H01L 21/02494; H01L 21/02381; H01L 21/02458; H01L 29/2003; H01L 21/30625; H01L 21/0254; H01L 21/02664; H01L 21/3228
See application file for complete search history.

(56) References Cited

U.S. PATENT DOCUMENTS 8,212,259 B2    7/2012   Flynn et al.
8,329,565 B2 *  12/2012  Arena ............... H01L 21/02458
                                                   438/478
(Continued)

OTHER PUBLICATIONS

Lee et al. "Doping level-dependent dry-etch damage in n-type GaN", Journal of Electroceramics, vol. 17, No. 2-4, Dec. 2006, pp. 227-230 See Priority U.S. Appl. No. 14/464,158, filed Aug. 20, 2014.

*Primary Examiner* — Latanya N Crawford
(74) *Attorney, Agent, or Firm* — Seed IP Law Group LLP

(57) ABSTRACT

A method is for treating a doped gallium nitride substrate of a first conductivity type, having dislocations emerging on the side of at least one of its surfaces. The method may include: a) forming, where each dislocation emerges, a recess extending into the substrate from the at least one surface; and b) filling the recesses with doped gallium nitride of the second conductivity type.

30 Claims, 1 Drawing Sheet

(51) Int. Cl.
  *H01L 21/306* (2006.01)
  *H01L 21/322* (2006.01)
  *H01L 29/20* (2006.01)
  *H01L 29/66* (2006.01)
  *H01L 29/36* (2006.01)
  *H01L 29/872* (2006.01)

(52) U.S. Cl.
  CPC .... *H01L 21/30625* (2013.01); *H01L 21/3228* (2013.01); *H01L 29/2003* (2013.01); *H01L 29/36* (2013.01); *H01L 29/66212* (2013.01); *H01L 29/872* (2013.01)

(56) References Cited

U.S. PATENT DOCUMENTS

| | | | |
|---|---|---|---|
| 2001/0009167 A1 | 7/2001 | Davis et al. | |
| 2003/0162340 A1 | 8/2003 | Tezen | |
| 2003/0209185 A1 | 11/2003 | Ueno et al. | |
| 2007/0096239 A1 | 5/2007 | Cao et al. | |
| 2007/0138505 A1 | 6/2007 | Preble et al. | |
| 2007/0160745 A1* | 7/2007 | Park | C08G 59/40 427/66 |
| 2007/0259504 A1 | 11/2007 | Bour et al. | |
| 2008/0105903 A1 | 5/2008 | Kodama et al. | |
| 2008/0272408 A1* | 11/2008 | Vora | H01L 21/761 257/272 |
| 2010/0044718 A1* | 2/2010 | Hanser | C30B 25/02 257/76 |
| 2010/0133548 A1* | 6/2010 | Arena | H01L 21/02458 257/76 |
| 2010/0155704 A1* | 6/2010 | Oh | H01L 21/0237 257/28 |
| 2010/0323506 A1 | 12/2010 | Cheng et al. | |
| 2010/0327291 A1* | 12/2010 | Preble | C30B 25/02 257/76 |
| 2011/0101369 A1 | 5/2011 | Zhu | |
| 2011/0121357 A1 | 5/2011 | Lester et al. | |
| 2011/0198590 A1* | 8/2011 | Preble | C30B 25/02 257/49 |
| 2011/0212603 A1* | 9/2011 | Arena | H01L 21/02458 438/478 |
| 2011/0309327 A1* | 12/2011 | Jeong | H01L 33/32 257/13 |
| 2013/0032814 A1* | 2/2013 | Bour | H01L 21/0254 257/76 |
| 2013/0056743 A1* | 3/2013 | Bour | H01L 29/32 257/76 |
| 2013/0082273 A1* | 4/2013 | Ting | H01L 21/02458 257/76 |
| 2013/0153921 A1 | 6/2013 | Cho et al. | |
| 2014/0048902 A1 | 2/2014 | Raj et al. | |
| 2014/0057417 A1* | 2/2014 | Leirer | H01L 21/02458 438/478 |
| 2014/0183594 A1 | 7/2014 | Loffler et al. | |

* cited by examiner

METHOD FOR TREATING A GALLIUM NITRIDE LAYER COMPRISING DISLOCATIONS

CROSS REFERENCE TO RELATED APPLICATIONS

This application is a continuation application of pending U.S. Patent Publication No. 2015/0064881 published Mar. 5, 2015, which claims the priority benefit of French Patent Application No. 13/58324, filed on Aug. 30, 2013, the contents of which are hereby incorporated by reference in their entireties to the maximum extent allowable by law.

FIELD OF THE INVENTION

The present disclosure relates to the forming of electronic components inside and on top of single-crystal gallium nitride substrates. It more specifically relates to a method for treating or preparing a doped single-crystal gallium nitride substrate for the forming of electronic components inside and on top of this substrate.

BACKGROUND

Electronic components, and especially power components such as Schottky diodes, have already been formed by using doped single-crystal gallium nitride as a semiconductor material.

Conventionally, gallium nitride substrates may be solid substrates, of a thickness ranging from a few tens to a few hundreds of micrometers, or appear in the form of a gallium nitride layer having a thickness of a few micrometers coating a support of another material, for example, a silicon support.

Whether they are solid (freestanding) or supported by a support material, gallium nitride substrates generally have dislocations, corresponding to discontinuities in the organization of their crystal structure. Such dislocations may raise issues in certain applications.

SUMMARY

Thus, an embodiment provides a method of treating a doped gallium nitride substrate of a first conductivity type, having dislocations emerging on the side of at least one of its surfaces, comprising: a) forming, where each dislocation emerges, a recess extending into the substrate from the at least one surface; and b) filling the recesses with doped gallium nitride of the second conductivity type.

According to an embodiment, step b) comprises a step of epitaxial deposition, on the at least one surface, of a doped single-crystal gallium nitride layer of the second conductivity type, followed by a step of planarization of this layer.

According to an embodiment, during the planarization step, the gallium nitride layer is removed everywhere except from the recesses.

According to an embodiment, the planarization step comprises a chem.-mech. polishing.

According to an embodiment, at step a), the recesses are formed by means of a wet etching solution applied on the at least one surface.

According to an embodiment, the etching solution comprises potassium hydroxide at a concentration in the range 10 to 90%.

According to an embodiment, the etching solution comprises phosphoric hydroxide at a concentration in the range 10 to 90%.

According to an embodiment, at step a), the recesses are formed by means of a chlorine plasma.

According to an embodiment, at step a), the forming of the recesses comprises a step of annealing the substrate at a temperature greater than or equal to 830° C.

According to an embodiment, the first and second conductivity types respectively are type N and type P.

Another embodiment provides a method for manufacturing a gallium nitride semiconductor component, comprising: treating, according to the above-mentioned method, a doped gallium nitride substrate of a first conductivity type, having dislocations emerging on the side of at least one of its surfaces; and depositing at least one conductive, semiconductor, or insulating layer on the at least one surface.

According to an embodiment, the component is a Schottky diode, and the conductive, semiconductor, or insulating layer is a metal layer.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

In the rest of the present description, unless otherwise indicated, terms "on the order of", "approximately", "substantially" and "around" mean to within ten percent.

Figure 1A:
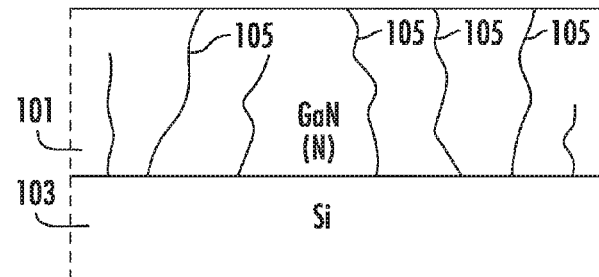
FIGS. 1A to 1D are cross-section views schematically illustrating an example of an embodiment of a method for treating a gallium nitride substrate for the forming of electronic components inside and on top of this substrate.

FIG. 1A schematically shows an N-type doped single-crystal gallium nitride substrate 101 (GaN). In this example, substrate 101 is formed on a silicon support 103. The described embodiments are however compatible with solid gallium nitride substrates (freestanding).

As appears in FIG. 1A, substrate 101 comprises dislocations. Some of these dislocations, referred to as 105 in the drawing, emerge on the side of the surface of substrate 101 opposite to silicon support 103, which will be called hereafter, by convention, the upper surface of substrate 101.

Emerging dislocations 105 are capable of causing malfunctions in electronic components where one or several conductive, semiconductor, or insulating layers 110 coat the upper surface of substrate 101. They are particularly problematic when a Schottky diode comprising a Schottky contact between substrate 101 and a conductive layer 110, for example, made of metal, coating the upper surface of substrate 101, is desired to be formed. Indeed, the contact areas between dislocations 105 and the conductive layer form areas of lower potential barrier in the Schottky junction, which locally decreases the reverse withstand voltage of the diode and increases reverse leakage currents with respect to a diode comprising no dislocation emerging on the Schottky contact.

It is here provided to treat substrate 101 to overcome all or part of the disadvantages linked to the presence of dislocations 105 emerging on its upper surface side.

To achieve this, it is provided to open an upper portion of dislocations 105 emerging on the upper surface side of substrate 101, that is, to form in substrate 101, on its upper surface side, recesses in front of dislocations 105, and then to fill the openings with gallium nitride of a conductivity type opposite to that of the substrate.

Figure 1B:
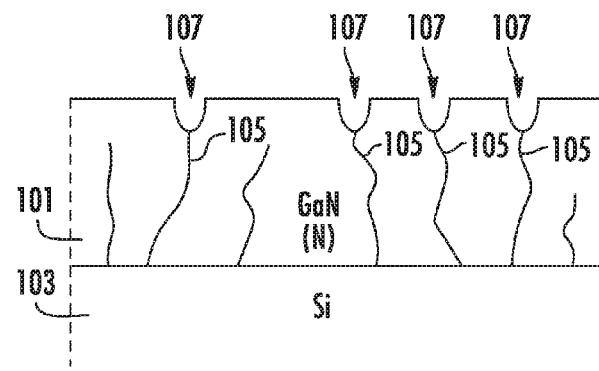

FIG. 1B illustrates a step of forming recesses 107 in substrate 101, on the upper surface side thereof, opposite to dislocations 105 emerging on the upper surface side of the substrate.

In a preferred embodiment, to form recesses 107, the upper surface of substrate 101 is placed in contact with a chemical etching solution capable of preferentially etching the areas of substrate 101 surrounding dislocations 105 over the areas of substrate 101 comprising no dislocations emerging on the upper surface of the substrate. A solution based on potassium hydroxide (KOH) may for example be used. As a variation, a solution based on orthophosphoric acid ($H_3PO_4$) may be used. To obtain a marked etching of the substrate areas surrounding dislocations 105, the concentration of the etching agent in the solution is preferably relatively high, for example, in the range 10% to 90% in the case of potassium hydroxide or of orthophosphoric acid.

As a variation, to form recesses 107, the upper surface of substrate 101 may be submitted to an etching plasma, for example, a chlorinated or argon plasma or any other appropriate etching gas.

As a variation, to form recesses 107, substrate 101 may be annealed at a relatively high temperature, preferably higher than 830° C., which causes an opening of the upper portion of dislocations 105 emerging on the upper surface of the substrate.

More generally, any method capable of forming recesses 107 extending in substrate 101 from its upper surface, opposite to dislocations 105, may be used.

As an example, recesses 107 extend in substrate 101 from its upper surface down to a depth approximately in the range from 0.2 to 10 µm, and have a diameter or a width approximately in the range from 0.001 to 0.5 µm.

In the shown example (FIGS. 1C and 1D), to fill recesses 107, it is provided to form, by epitaxy, a doped gallium nitride layer of a conductivity type opposite to that of the substrate (that is, a P-type layer in this example) coating the upper surface of substrate 101, and then to planarize this layer to remove it everywhere except inside of recesses 107.

Figure 1C:
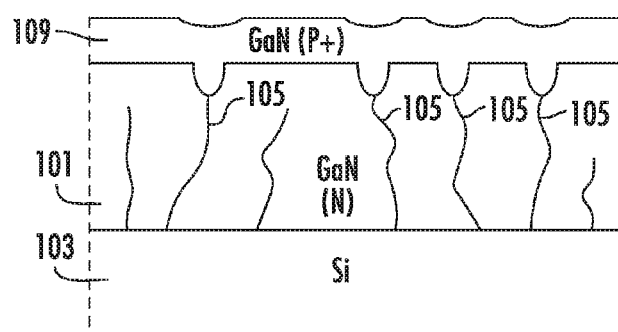

FIG. 1C illustrates a step, subsequent to the step of forming of recesses 107, of epitaxial deposition of a P-type doped single-crystal gallium nitride layer 109 over the entire surface of substrate 101. Layer 109 is for example formed by chemical vapor deposition, according to a method currently called metal organic chemical vapor deposition, MOCVD, in the art. As a variation, layer 109 is formed according to a method currently called MBE ("Molecular Beam Epitaxy") in the art or by a method currently called RPCVD ("Remote Plasma Chemical Vapor Deposition") in the art. Any other method capable of depositing a doped gallium nitride layer of a conductivity type opposite to that of substrate 101 may be used. To obtain a P-type doping, magnesium may for example be provided in the deposition source. The doping level of layer 109 is preferably greater than that of substrate 101. As an example, substrate 101 has a doping level in the range $10^{15}$ to $2*10^{16}$ atoms/cm³, and layer 109 has a doping level greater than $10^{17}$ atoms/cm³.

The thickness of layer 109 is preferably selected to totally fill recesses 107, for example all the way to the upper surface level of substrate 101. As an example, layer 109 has a thickness in the range 0.2 to 15 µm.

Figure 1D:
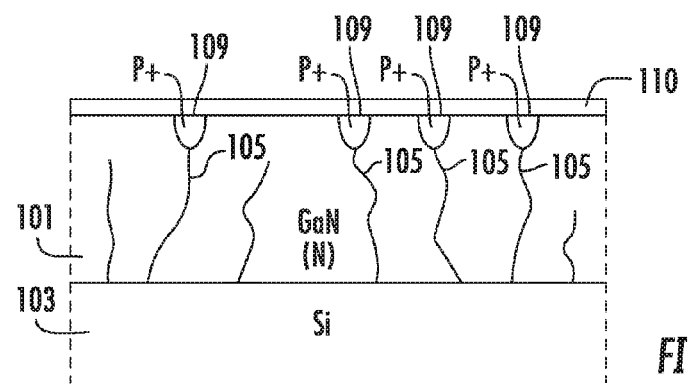

FIG. 1D illustrates a planarization step, following the deposition of layer 109, during which layer 109 is thinned from its upper surface, until it is totally removed opposite to the regions substrate 101 which have not been recessed at the step described in relation with FIG. 1B, to clear the access to the upper surface of substrate 101 in these regions. During the planarization step, the P-type doped gallium nitride of layer 109 is removed everywhere except from recesses 107. A small thickness of substrate 101 may possibly be removed during the planarization, to guarantee the removal of any P-type doped gallium nitride residue from the upper surface of the regions of substrate 101 which have not been recessed at the step described in relation with FIG. 1B. The planarization is interrupted before reaching the bottom of recesses 107, to keep P-type doped gallium nitride areas forming an interface between dislocations 105 and the upper surface of the semiconductor structure. In a preferred embodiment, the planarization step of FIG. 1D is performed at least partly and preferably totally by chem.-mech. polishing (CMP).

An advantage of the embodiment described in relation with FIGS. 1A to 1D is that it enables to avoid for dislocations of the substrate to directly emerge on a surface of the substrate intended to receive conductive, semiconductor, or insulating layers of a semiconductor gallium nitride component.

This embodiment is particularly advantageous for the forming of a Schottky diode comprising a Schottky contact between substrate 101 and a conductive layer 110, for example, made of metal, coating the upper surface of substrate 101. Indeed, the presence of the P-type doped local interface regions enables to avoid a drop of the potential barrier at dislocations 105 when the diode is reverse-biased. This enables to improve the reverse withstand voltage of the diode. This further enables to decrease reverse current leakages in the diode via dislocations 105. It should be noted that in the case of a Schottky diode, the doping level of the P-type regions should be sufficiently high for the reverse withstand voltage of the diode to take place at the level of the Schottky interface, and not at the level of the PN diodes formed between the P-type gallium nitride filling recesses 107 and substrate 101.

Specific embodiments have been described. Various alterations, modifications, and improvements will readily occur to those skilled in the art.

In particular, the above-described embodiments are not limited to the forming of a diode comprising a Schottky contact between substrate 101 and a conductive layer 110 coating the upper surface of the substrate. The method for treating substrate 101 described in relation with FIGS. 1A to 1D may be used for the forming of other gallium nitride semiconductor components, for example, PN power diodes, bipolar power transistors, light-emitting diodes, heterojunction transistors, heterojunction diodes, or any other gallium nitride component capable of taking advantage of the provided treatment of the dislocations emerging on the upper surface side of the substrate.

Further, the described embodiments are not limited to the treatment of only the dislocations emerging on the upper surface side of the substrate. Thus, in the case of a solid (freestanding) substrate, it will be within the abilities of those skilled in the art to adapt the method described in relation with FIGS. 1A and 1B to treat not only dislocations emerging on the upper surface side of the substrate, but also dislocations emerging on the lower surface side of the substrate if this is advantageous for the envisaged use of the substrate.

Further, the described embodiments are not limited to the treating of an N-type doped gallium nitride substrate, but may be applied to the treating of a P-type doped substrate. In this case, it will be provided to fill with N-type doped gallium nitride recesses 107 formed at the step of FIG. 1B.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

That which is claimed is:

1. A semiconductor device comprising:
   a substrate;
   a doped gallium nitride layer on said substrate and having a plurality of dislocations emerging at a first side of the doped gallium nitride layer;
   a recess extending into through a first surface of the first side of the doped gallium nitride layer at each dislocation; and
   a doped single-crystal gallium nitride body in each recess, the first surface of the doped gallium nitride layer being coplanar with a second surface of the doped single-crystal gallium nitride bodies, each dislocation ending at a location spaced away from the first and second surfaces.

2. The semiconductor device according to claim 1, further comprising at least one additional layer on the doped gallium nitride layer and the doped single-crystal gallium nitride bodies.

3. The semiconductor device according to claim 2 wherein the at least one additional layer is conductive.

4. The semiconductor device according to claim 2 wherein the at least one additional layer is a semiconductor layer.

5. The semiconductor device according to claim 2 wherein the at least one additional layer is an insulating layer.

6. The semiconductor device according to claim 1 wherein the doped gallium nitride layer is an n-type material and the doped single-crystal gallium nitride bodies are a p-type material.

7. The semiconductor device according to claim 1 wherein the doped gallium nitride layer is a p-type material and the doped single-crystal gallium nitride bodies are an n-type material.

8. The semiconductor device according to claim 1 wherein the substrate comprises silicon.

9. The semiconductor device according to claim 1 wherein each recess extends to a depth in a range of 0.2 to 10 microns.

10. The semiconductor device according to claim 1 wherein each recess has a width in a range of 0.001 to 0.5 microns.

11. The semiconductor device according to claim 1 wherein the doped gallium nitride layer has a dopant concentration in a range of $10^{15}$ to $2*10^{16}$ atoms/cm$^3$.

12. The semiconductor device according to claim 1 wherein each doped single-crystal gallium nitride body has a dopant concentration greater than $10^{17}$ atoms/cm$^3$.

13. The semiconductor device according to claim 2 wherein the doped gallium nitride layer, doped single-crystal gallium nitride bodies and the at least one additional layer define at least one of a Schottky diode, a PN power diode, a bipolar power transistor, a light-emitting diode, a heterojunction transistor, and a heterojunction diode.

14. The semiconductor device according to claim 2 wherein a third surface of the at least one additional layer is coplanar with the first surface of the doped gallium nitride layer and the at least one additional layer is in direct contact with both the doped gallium nitride layer and each doped single-crystal gallium nitride body.

15. A Schottky diode comprising:
    a doped gallium nitride layer having a dislocation emerging at a first surface of a first side of the doped gallium nitride layer;
    a recess extending into the first side of the doped gallium nitride layer at the dislocation;
    a doped single-crystal gallium nitride body in the recess, the doped single-crystal gallium nitride body interrupting the dislocation, a second surface of the first side of the doped gallium nitride layer being coplanar with a third surface of the doped single-crystal gallium nitride body; and
    a metal layer on the doped gallium nitride layer and doped single-crystal gallium nitride body.

16. The Schottky diode according to claim 15 wherein the doped gallium nitride layer is an n-type material and the doped single-crystal gallium nitride body is a p-type material.

17. The Schottky diode according to claim 15 wherein the doped gallium nitride layer is an n-type material and the doped single-crystal gallium nitride body is a p-type material.

18. The Schottky diode according to claim 15 wherein the recess extends to a depth in a range of 0.2 to 10 microns.

19. The Schottky diode according to claim 15 wherein the recess has a width in a range of 0.001 to 0.5 microns.

20. The Schottky diode according to claim 15 wherein the doped gallium nitride layer has a dopant concentration in a range of $10^{15}$ to $2*10^{16}$ atoms/cm$^3$.

21. The Schottky diode according to claim 15 wherein the doped single-crystal gallium nitride body has a dopant concentration greater than $10^{17}$ atoms/cm$^3$.

22. The Schottky diode according to claim 15 wherein a fourth surface of the metal layer is coplanar with the second surface of the doped gallium nitride layer, the metal layer and the metal layer is in direct contact with both the doped gallium nitride layer and the each doped single-crystal gallium nitride body.

23. A semiconductor device comprising:
    a doped gallium nitride layer having a plurality of dislocations below a first surface, the doped gallium nitride layer having a first conductivity type;
    a recess extending through the first surface of the doped gallium nitride layer at ones of the plurality of dislocations, the ones of the plurality of dislocations ending at the recess;
    a doped single-crystal gallium nitride body filling each recess, the doped single-crystal gallium nitride body having a second conductivity type, a second surface of the doped single-crystal gallium nitride bodies coplanar with the first surface of the doped gallium nitride layer; and
    at least one additional layer on the doped gallium nitride layer and doped single-crystal gallium nitride bodies.

24. The semiconductor device according to claim 23 wherein the at least one additional layer comprises an electrically conductive layer.

25. The semiconductor device according to claim 24 wherein the electrically conductive layer comprises metal.

26. The semiconductor device according to claim 23 wherein the at least one additional layer comprises a semiconductor layer.

27. The semiconductor device according to claim 23 wherein the at least one additional layer comprises an insulating layer.

28. The semiconductor device according to claim 23 further comprising a substrate supporting the doped gallium nitride layer.

29. The semiconductor device according to claim 23 wherein the doped gallium nitride layer, doped single-crystal gallium nitride bodies and the at least one additional layer define at least one of a Schottky diode, a PN power diode, a bipolar power transistor, a light-emitting diode, a heterojunction transistor, and a heterojunction diode.

30. The semiconductor device according to claim 23 wherein a third surface of the at least one additional layer is coplanar with the first surface of the doped gallium nitride layer and the at least one additional layer is in direct contact with both the doped gallium nitride layer and each doped single-crystal gallium nitride body.

* * * * *

UNITED STATES PATENT AND TRADEMARK OFFICE
CERTIFICATE OF CORRECTION

PATENT NO. : 9,991,341 B2
APPLICATION NO. : 15/363616
DATED : June 5, 2018
INVENTOR(S) : Arnaud Yvon Page 1 of 1

It is certified that error appears in the above-identified patent and that said Letters Patent is hereby corrected as shown below:

In the Claims

Column 5, Line 23:
"a recess extending into through a first surface" should read, --a recess extending through a first surface--.

Signed and Sealed this
Sixth Day of November, 2018

Andrei Iancu
*Director of the United States Patent and Trademark Office*